March 18, 1969 T. E. BYRD 3,434,022

SEMICONDUCTOR CONTROLLED RECTIFIER DEVICE

Filed Jan. 27, 1967

INVENTOR.
Theodore E. Byrd

BY

Mueller, Aichele & Rauner

ATTYS.

United States Patent Office 3,434,022

Patented Mar. 18, 1969

3,434,022

SEMICONDUCTOR CONTROLLED RECTIFIER DEVICE

Theodore E. Byrd, Phoenix, Ariz., assignor to Motorola, Inc., Franklin Park, Ill., a corporation of Illinois Filed Jan. 27, 1967, Ser. No. 612,197

U.S. Cl. 317—235 6 Claims

Int. Cl. H01l *13/00, 3/00*

ABSTRACT OF THE DISCLOSURE

A semiconductor controlled rectifier device having four layers or regions of alternate conductivity type semiconductor material defining three PN junctions, and the intermediate PN junction being operative in the reverse breakdown mode when the device is triggered into conduction. A fourth PN junction is formed by an additional semiconductor region located between the parent region of the device and a point of reference potential, and this additional region provides a low impedance path to carrier flow when the device turns off, thereby substantially decreasing the switching time of the device.

This invention relates generally to semiconductor switching devices and circuits and more particularly to a new semiconductor controlled rectifier device having an extremely fast turn-off and overall switching time.

*Background of the invention*

The typical semiconductor controlled rectifier, often synonomously referred to as a silicon controlled rectifier and abbreviated SCR, consists of four layers of adjacent semiconductor regions of alternate P and N conductivity types, which regions define three PN junctions within the rectifier. As is well known by those skilled in the art, the middle junction of the SCR must be biased to reverse conduction or breakdown before the SCR will conduct, and this is normally accomplished by a turn-on or gating pulse applied to one of the intermediate regions of the SCR. The intermediate region is commonly referred to as the gate region. Immediately after the turn-on or gating pulse is removed from the gate region, the reverse bias condition at the middle junction of the SCR is no longer present and the SCR will begin to turn off.

The major factor governing turn-off or recovery time in an SCR is the recombination rate of charge carriers within the SCR semiconductor regions. When a typical SCR or four-layer diode begins to turn off, a high impedance to carrier movement is presented by the middle PN junction of the SCR since this junction is forward biased against carrier return or recombination current to the parent region of the SCR bounding the mdidle PN junction. This intermediate junction which presents a high impedance to carrier movement in the SCR is responsible for a relatively slow recovery or response time of an SCR which may be as long as twenty microseconds. This long response or recovery time is quite disadvantageous where the SCR is used in high speed switching applications requiring much faster switching times.

*Summary of the invention*

It is an object of this invention to provide a new and improved silicon controlled rectifier switching device having a recovery time and an overall switching time which is much less than that of presently known SCR devices.

Another object of this invention is to provide a new and improved SCR switching device which is simple, easy and inexpensive to construct using presently known integrated circuit construction techniques.

The present invention features an SCR type device having a low impedance discharge path in which charge carriers within the device may move when the SCR is turned off. This path is provided by an extra PN junction formed by a PN diode integrally connected with SCR structure in such a manner as to provide a low impedance recombination current path to the parent region of the SCR.

Briefly, the present invention includes alternate layers of P and N type conductivity semiconductor regions defining three PN junctions in a four-layer silicon controlled rectifier device. Upon the application of an input gating signal of a certain magnitude to the gate region of the device, the intermediate PN junction will become reverse biased and initiate conduction within the device. A semiconductor region, which is constructed to be integral with the SCR device but which does not functionally contribute to the normal forward SCR switching action, is connected between the second or parent region of the SCR and the output region of the device for providing a recombination current path to the parent region when the SCR turns off. Hence, SCR recovery time is greatly reduced by the provision of a novel low impedance carrier recombination path between the output region and the second or parent region of the device. This low impedance path effectively shunts the high impedance intermediate PN junction of the device during device turn off.

*Description of the preferred embodiment*

Figures 1, 2, 3, 4:
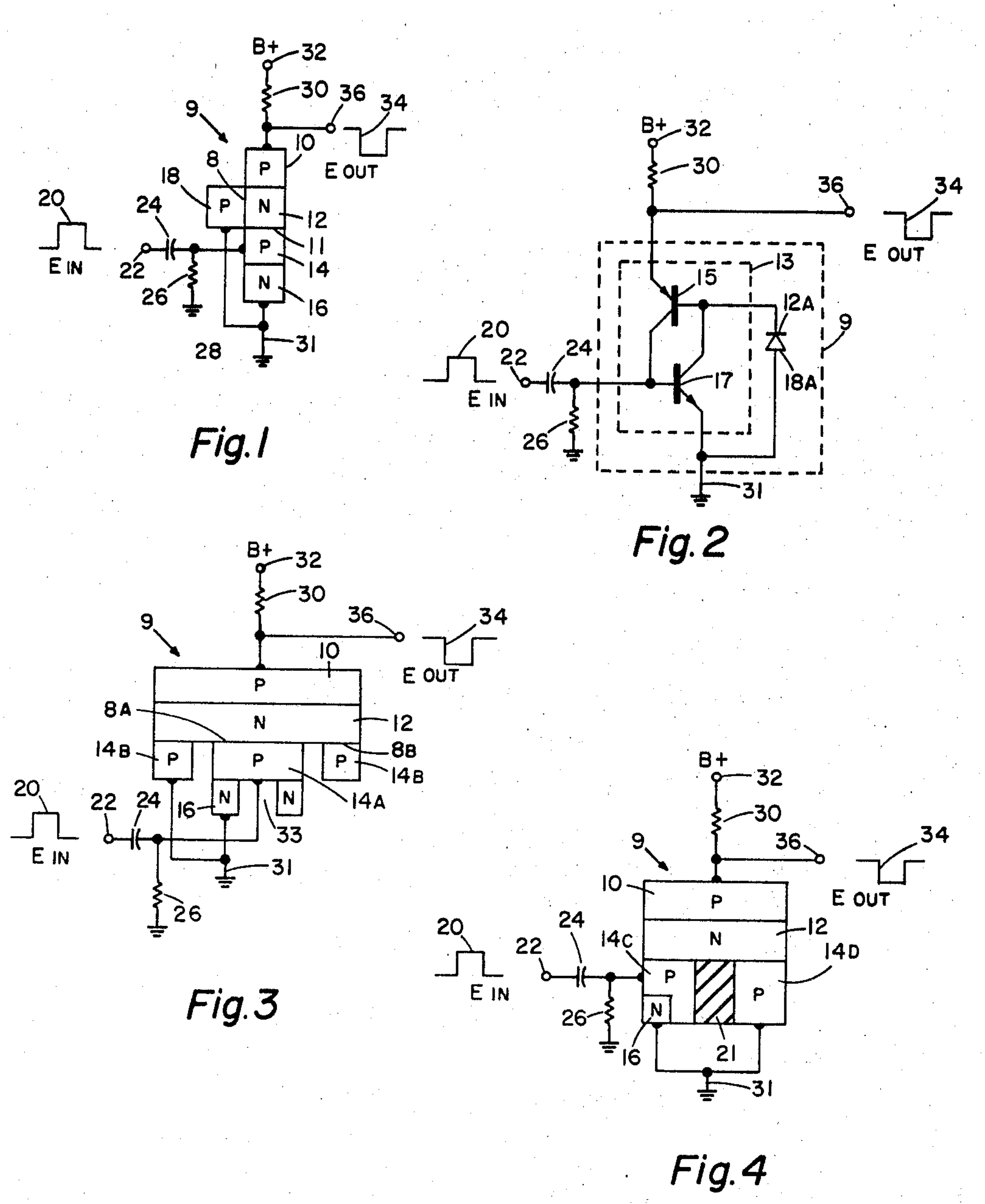
FIG. 1 is an electronic circuit embodying the novel silicon controlled rectifier device according to this invention.
FIG. 2 illustrates the two-transistor analog of the SCR device of FIG. 1 within the same operational electronic circuitry as is shown in FIG. 1.
FIG. 3 illustrates one type of device geometry for the novel SCR device shown schematically in FIG. 1.
FIG. 4 illustrates another type of device geometry for the novel SCR device shown in FIG. 1.

Referring in somewhat more detail to the accompanying drawing, there is shown in FIG. 1 a novel semiconductor controlled rectifier device 9 which includes alternate P and N type conductivity regions 10, 12, 14 and 16 connected between an output load resistor 30 and a point of reference or ground potential 31. The SCR device 9 further includes a P type conductivity region 18 which is connected between the output region 16 and the second or N type parent region 12.

The novel SCR device 9 is shown in FIGS. 1 through 4 connected in a typical electronic circuit including an input coupling capacitor 24 conneted between an input terminal 22 and the third or P type gate region 14, and an input resistor 26 provides the necessary circuit input impedance for the SCR device 9. The resistor 26 is connected between the gate region 14 and ground potential. The load resistor 30 is connected between voltage supply terminal 32 and the first or P type conductivity region 10, and an output signal 34 may be derived from the output terminal 36 which is connected to the output load resistor 30.

When a positive input gating pulse 20 is applied to the input terminal 22 and coupled to the P type gate region 14 of the SCR device 9, the intermediate PN junction 11 of the device will become reverse biased into conduction and current will flow from the B+ supply, through the load resistor 30 and through the SCR device 9 to ground. The switching action produces the inverted pulse 34 at the output terminal 36 of the circuit.

Without the P type region 18, the device 9 would have a high impedance turn-off or carrier or recombination path when the input pulse 20 is removed from gate region 14 of the device 9. Typical recovery times for presently available four-layer PNPN SCR switches have been measured between 10 and 20 microseconds. However, with the provision of the P type region 18 in accordance with this invention, a low impedance carrier recombination path is provided between the current output N type region 16 and the second or N type parent region 12, and this low impedance recombination current path reduces the turn off or recovery time of four-layer SCR's from 60 to 80 percent of the time required when the region 18 is absent.

When the device 9 is switched on by the application of an input pulse 20, the PN junction 8 between regions 12 and 18 is reverse biased and this additional region 18 does not affect the normal operation of the SCR. However, when the gate pulse 20 is removed from the input terminal 22, the PN junction 8 is forward biased and provides the above mentioned low impedance recombination current path from ground to the N type parent region 12.

The circuit of FIG. 2 illustrates the two transistor analog of the four-layer SCR and a discussion of this transistor analog network can be found in Stasior, "Helpful Transistor Analog: Four-Layer PNPN≈Two Transistors," Electronics, Aug. 10, 1964, pp. 66–73. The network 13 is a transistor analog of the alternate P and N type conductivity layers 10, 12, 14 and 16 and consists of a PNP transistor 15 connected to PNP transistor 17 with the base-collector paths of the two transistors connected in series. These complementary transistors 15 and 17 are connected in a regenerative feedback configuration, and the base current into the NPN transistor 17 is multiplied by the NPN current gain beta and becomes base current for the PNP transistor 15. After being multiplied by the PNP beta it reinforces the initial NPN base current to transistor 17. If the reinforcing current exceeds the initial base current, that is, if the NPN beta multiplied by the PNP beta is greater than or equal to one, the current builds up regeneratively, driving both transistors 15 and 17 into saturation. Therefore, the product of the NPN beta multiplied by the PNP beta is a critical factor that determines if the PNP transistor analog 15 will switch on.

In the circuit of FIG. 2*a* separate diode having an anode **18*a* and cathode 12*a* schematically represents and is equivalent to the diode formed by the P and N type regions 18 and 12 in FIG. 1. This diode is connected between a common junction 29 for transistors 15 and 17 and ground potential 31**.

FIG. 3 illustrates one device geometry for the SCR device 9 that may be advantageously used to provide the diode return path from ground to the parent region 12. This geometry includes P and N type regions 10 and 12 which may be alloyed or formed using epitaxial growth or other known semiconductor device construction techniques. Using well known masking and etching process steps, P regions **14*a* and 14*b* can be formed on the surface of the N type region 12, and the P type regions 14*a* and 14*b* have been electrically isolated using selective etching and masking processes. The N type region 16 may be formed on the surface of the center P type region 14*a*, and an opening 33 is thereafter etched in the N type region 16 to permit electrical coupling to the gate or P type region 14*a*. The P type region 14*b* forms a PN junction 8*b* with the N type parent region 12, and junction 8*b* becomes forward biased when the pulse 20 is removed from the gate region 14*a* and the device 9 begins to turn off. Since the regions 14*a* and 14*b* will be initially formed as a continuous layer using epitaxial growth, diffusion or alloying techniques and thereafter etched to form separate regions 14*a* and 14*b*, the PN junction portions 8*a* and 8*b* for the reverse and forward conducting portions of junction 8 will have identical electrical characteristics. This will permit the junction portion 8*a* between region 14*a* and region 12 to turn off as the junction portion 8*b* between region 14*b* and region 12** turns on and vice-versa.

FIG. 4 illustrates another form of device geometry used in the construction of the SCR device 9 and includes a P type region through which an opening has been cut and filled with an insulating material 21 to electrically isolate the left and right hand P type regions **14*c* and 14*d* respectively. Due to this requirement for electrical isolation regions 14*c* and 14*d* are physically separated and not of an annular type geometry. An N type region 16 has been formed in the left hand P type region 14*c*** and this formation may be accomplished using diffusion or other well known integrated circuit construction techniques.

What is claimed is:

1. In an electronic circuit including a semiconductor device having first, second, third and fourth semiconductor regions of alternate P and N conductivity types defining three PN junctions within the four regions, one of the regions connectable to a source of gate pulses for providing a reverse bias condition at the intermediate PN junction and enabling the semiconductor device to conduct, the improvement comprising low impedance carrier recombination means connected between the second and fourth regions of the device for providing a low impedance recombination current path for the device when it is turned off.

2. The electronic circuit according to claim 1 wherein the low impedance carrier recombination means includes a fifth semiconductor region forming with the second semiconductor region a PN diode which becomes forward biased when the semiconductor device is turned off and provides said low impedance discharge path for charge carrier recombination into the second region of the device.

3. The circuit according to claim 1 wherein said recombination means is a recombination diode formed by a fifth semiconductor region of one conductivity type in contact with said second region and said fifth region formed from the same layer of semiconductor material from which said third region is formed thereby insuring that the PN junction of said recombination diode and the PN junction between said second and third semiconductor regions have substantially identical electrical characteristics.

4. A semiconductor controlled rectifier device including, in combination: first, second, third and fourth semiconductor regions of alternate conductivity types defining three PN junctions which are adapted to conduct upon the application of a gating pulse to one of the regions which reverse biases into conduction the intermediate PN junction of the device, and a fifth semiconductor region connected between said second and fourth semiconductor regions and forming a PN junction with said second region for providing a low impedance recombination current path within said device when the gating pulse is removed and the device begins to turn off.

5. The device according to claim 4 wherein said third and fifth regions are formed from a single layer of semiconductor material having an opening therein for providing electrical isolation between said third and fifth regions.

6. The device according to claim 5 which further includes an insulating material within said opening to ensure good electrical isolation between said third and said fifth regions.

(References on following page)

References Cited

UNITED STATES PATENTS

| | | | |
|---|---|---|---|
| 3,089,041 | 5/1963 | Boensel | 307—300 |
| 3,246,172 | 4/1966 | Sanford | 307—88.5 |
| 3,307,049 | 2/1967 | Von Bernuth | 307—88.5 |

JOHN W. HUCKERT, *Primary Examiner.*

M. EDLOW, *Assistant Examiner.*

U.S. Cl. X.R.

307—305, 252